United States Patent [19]

Goad

[11] Patent Number: 4,740,966
[45] Date of Patent: Apr. 26, 1988

[54] ANALOG INPUT CIRCUIT FOR MICROCONTROLLER APPARATUS

[75] Inventor: James R. Goad, Newark, Calif.

[73] Assignee: Texas Instruments Incorporated, Dallas, Tex.

[21] Appl. No.: 913,831

[22] Filed: Sep. 30, 1986

[51] Int. Cl.$^4$ ............................................... H04J 3/04
[52] U.S. Cl. .................................... 370/112; 307/243; 328/104
[58] Field of Search ................ 370/112, 114; 307/243, 307/244; 328/104, 105

[56] References Cited

U.S. PATENT DOCUMENTS 3,723,879  3/1973  Kaul et al. ........................... 370/112
4,146,750  3/1979  Spiesman ............................. 370/112

OTHER PUBLICATIONS

MO56 Microcontroller Schematic-Analog Input Circuit.

Primary Examiner—Douglas W. Olms
Assistant Examiner—Frank M. Scutch, III
Attorney, Agent, or Firm—John A. Haug; James P. McAndrews; Melvin Sharp

[57] ABSTRACT

A plurality of differential analog input channels are multiplexed into a programmable gain amplifier providing four input ranges. The circuit is self-calibrating under microprocessor control with periodic measurements taken of internal channels for analog ground voltage, analog reference voltage and the voltage reference temperature in addition to the analog input signals. The output of the isolation amplifier is fed into a sample and hold circuit and, under the control of an analog input register into an analog to digital converter. An earth barrier separates a primary side which includes the input channels, optically isolated bidirectional MOSFET relays coupled to the input channels, a programmable, selectable gain multiplexer and the input to an isolation amplifier from a secondary side by means of opto isolators bridging the earth barrier. The secondary includes the sample and hold circuit, the power supply, the analog to digital converter, the analog control register, the voltage reference source and decoders.

7 Claims, 4 Drawing Sheets

ANALOG INPUT CIRCUIT FOR MICROCONTROLLER APPARATUS

BACKGROUND OF THE INVENTION

1. Field of the Invention

This invention relates generally to input circuits and more specifically to a circuit for inputting analog voltage signals from a plurality of channels to a controller.

2. Description of the Prior Art

A micropowered microcontroller is available in the market which uses CMOS technology to reduce its power consumption to as little as five watts. The microcontroller is designated as the 8640 Industrial Microcontroller made and sold by Texas Instruments Incorporated and is an intelligent, programmable device which integrates measurements, computation, control and communications in a stand alone industrial package. The microcontroller provides an array of inputs, including, eight differential analog input channels multiplexed into a programmable gain amplifier which provides several input ranges. An autoranging alogorithm can be enabled for each channel to automatically select the appropriate input gain range to track a changing input signal. The analog ground voltage, the analog reference voltage and the reference voltage temperature are periodically measured to automatically compensate each field channel measurement for offset and span changes in the circuit.

However, when used in hostile environments which include a common mode voltage, some means of isolation or front end signal conditioning is required, as by using transmitters to perform the isolation, isolation amplifiers on each of the channels, or the like. That is, in many environments, such as a typical factory environment, it is very difficult to consistently follow effective grounding procedures so that the possibility of the existence of a common mode both initially as well as over the course of time is very high. In order to overcome this problem the user of a microcontroller has to provide front end signal conditioners of some sort as mentioned above. For example, transmitters can be used with each channel to perform the required isolation and then the input circuit need only provide transient protection. However, on a channel by channel basis this can be very expensive and represents an undesirable cost burden.

Typically isolation can be effectively obtained by using reed relays because of their high stand-off voltage and very low on resistance however they require too much power and are not fast enough for use with high speed, multiplexed channel inputs of the microcontroller. Similarly, a "flying capacitor" approach which inherently involves time for stabilization of pump out current is also too slow to be effective in such a system.

In order for the microcontroller to function as intended, the input circuit must have in addition to having input-output and channel to channel isolation, a high single channel digitizing rate, high resolution, gain switching, high accuracy, transient immunity, wide temperature range, low power, high reliability, low cost and at least medium multiplexing speed. With regard to software it must have signal integration, offset, gain and temperature drift compensation and autoranging.

SUMMARY OF THE INVENTION

It is an object of the invention to provide an analog input circuit having a plurality of channels with high input-output and channel to channel isolation emulating reed switching without sacrificing reliability and speed. Another object is the provision of such a circuit which uses low power and yet is inexpensive. Yet another object of the invention is the provision of an input circuit having high voltage isolation with inherent front end correction circuitry. Another object is the provision of an input circuit which can be multiplexed and which has a wide band width to facilitate digitizing. Still another object is the provision of an input circuit which permits the digitizing of transients in order to analyze transient phenomena, as in applications involving motors, and which maintains an input-output isolation in the order of 750 volts AC and channel to channel isolation in the order of 250 volts. Another object is the provision of a low cost circuit which is reliable, has low power, environmental isolation and a multichannel error cancellation feature. Yet another object is the provision of a circuit having the features listed above.

Briefly, in accordance with the invention, optically isolated bidirectional MOSFET relays are used to provide high stand off voltage from channel to channel. Improved signal to noise ratio and improved common mode rejection are accomplished by implementing the gain stage prior to isolation and as close to the signal source as possible. Any error introduced with the gain stage is corrected by having three reference points from a voltage reference and correcting through software routines.

DESCRIPTION OF THE PREFERRED EMBODIMENT

Figure 1A:
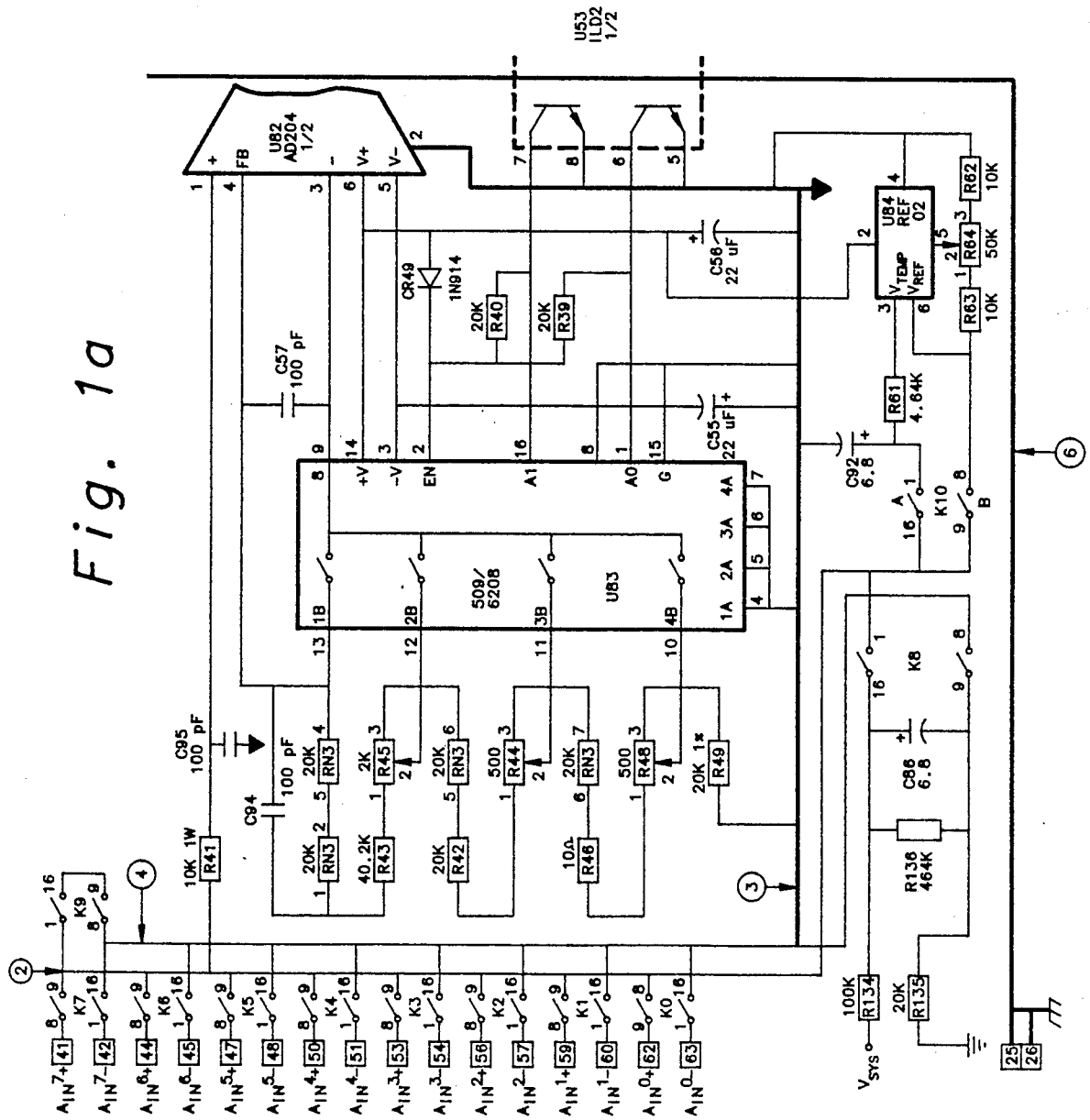
FIGS. 1a and 1b are a circuit schematic diagram of an eight channel analog input circuit made in accordance with the invention.
Figure 1B:
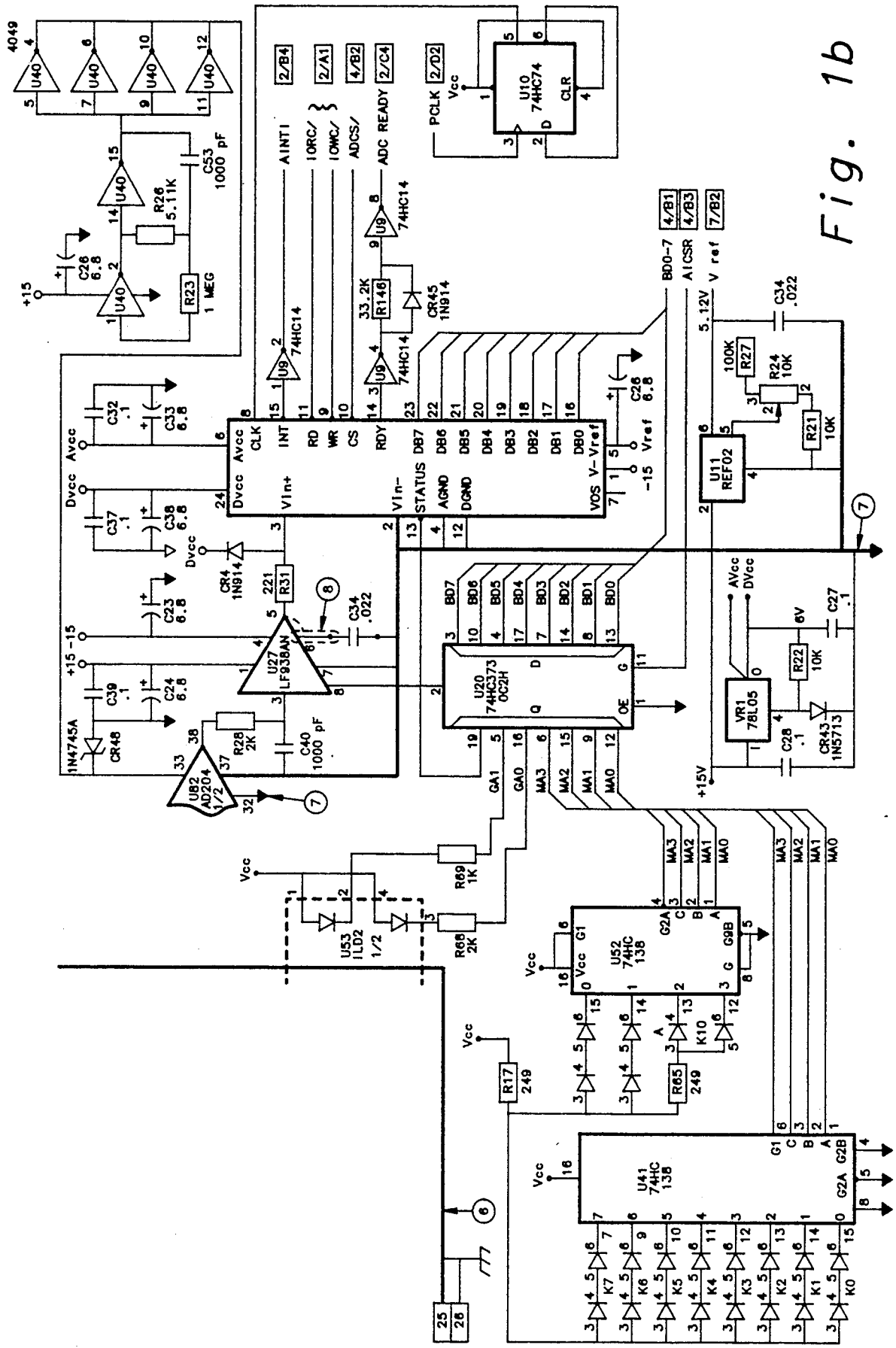

With reference to the drawing as seen at P2, eight differential analog input channels $A_{IN}0$ to $A_{IN}7$, positive and negative, are shown connected to relays in the form of optically isolated bidirectional MOSFET devices K0–K7 on each input line. The positive line 2 is connected through a bandwidth roll off filter comprising resistor R41 and capacitor C95 to pin 1 of an isolation amplifier U82. The negative line 3 is connected to the common of the isolation amplifier. The input and output of amplifier U82 are isolated from each other by means of a transformer coupling (not shown) bridging an earth drain 6.

Variable, programmable gain control is provided by multiplexer U83 and a percision resistive voltage divider for the input of amplifier U82. The feedback network is routed through input pins 4 and 3 of amplifier U82 and selected by one channel of multiplexer U83. Channel 1, comprising pins 13 and 9 of U83, is used for a gain range of 1 and does not employ the resistor stack. Channel 2, comprising pins 12 and 9, upon closure sums the values of resistors RN3 (4 to 3), RN3 (2 to 1), R43 and R45 (1 to 2) for its feedback resistance. This value is divided by the sum of all the remaining resistors in the stack i.e., R45 (2 to 3), RN 3 (6 to 5), R42, R44, RN3 (7 to 8), R46, R48 (1 to 3) and R49 to signal common 3. Channel 3, comprising pins 11 and 9, upon closure adds R45 (2 to 3), RN3 (6 to 5), R42 and R44 (1 to 2) to the feedback resistance. Channel 4, comprising pins 10 and 9, upon closure adds R44 (2 to 3), RN3 (7 to 8), R46 and R48 (1 to 2) to the feedback resistance. Multiplexer U83 is controlled by input register U20 in the secondary side through optical isolator U53. Roll off capacitors C57 and C94 are used to restrict bandwidth. The gains shown are 1, 2, 4 and 8 times to give selected resolution. It will be appreciated that the particular gains available can be modified by adjusting the values of the resistors in the stack. The output voltage to supply power to multiplexer U83 and to the temperature reference comes from isolation amplifier U82 on pins 6 and 5 which are V+ and V−.

Pin 6 (V+) is connected through biasing diode CR49 to pin 2 (EN) of multiplexer U83, to U84, a very precise voltage reference and to ground through decoupling capacitor C56. Pin 2 of amplifier U82 is connected signal common 3.

Optical isolator U53 bridges earth barrier 6 and has two digital outputs (pins 6 and 7) connected on the primary side to pins A0 and A1 respectively of multiplexer U83 under the control of Register U20 on the secondary side of the circuit via lines GA0 and GA1 respectively to select the appropriate gain.

Additional channels, relays K8, K9 and K10 are coupled to multiplexer U83 and amplifier U82 for internal signal sources. Relay K8 is connected to system voltage for diagnostic monitoring of system power. Relay K10 is connected to the voltage and temperature reference to facilitate correction of ambient temperature and voltage drift by software techniques. Contact 1 of relay K8 is connected to A+(line 2) while contact 16 is connected to $V_{SYS}$ through a resistor R134. Contact 8 of relay K8 is connected to signal common 3 and contact 9 to system ground through resistor R135. Resistor R136 and capacitor C86 are connected in parallel across contacts 16 and 9 and act as an attenuator and filter. Relay K10 has contact 9 connected to line 2 and contact 8 to pin 6 ($V_{REF}$) of U84. Pins 6, 5 and 4 of U84 are coupled together through resistors R63, R64 and R62 respectively with pin 4 connected to signal common 3 to provide reference adjustment. Contact 16 of relay K10 is connected to A+(line 2) and contact 1 is connected to pin 3 ($V_{TEMP}$) of reference U84 through filter R61-C92. Relay K9 has contact 8 connected to signal common 3 and contact 1 connected to A+(line 2) while contacts 9 and 16 are connected together to short A+(-line 2) to signal common 3 to provide a multichannel error cancellation technique, prevent slew rate related gain errors, prevent reverse voltage pump out, quench input transients and prevent overdriving of the input amplifier during gain switching.

Returning to the secondary side of the circuit, the output of amplifier U82, pin 38, is connected to pin 3 of sample and hold circuit U27 through roll off filter R28-C40 to reduce transients. Pin 32 of amplifier U82 is connected to analog common 7 and pin 37 is connected to pin 2 ($V_{IN-}$) of analog to digital converter U21 (ADC 1205). Amplifier U82 is powered by a plurality of CMOS inverters $U40_1$-$U40_6$ connected as a free running power oscillator and coupled to pin 33 of amplifier U82 to provide 15 volt drive swings. A positive 15 volts is coupled to $U40_1$ with decoupling capacitor C26. Pin 2 of inverter $U40_1$ is connected to pin 14 of inverter $U40_2$ with resistors R26 and R23 connected between pins 2 and 3 of $U40_1$. Resistor R26 and capacitor C53 are connected between pins 14 and 15 of inverter $U40_2$.

Pin 15 of inverter $U40_2$ is connected to the input of parallel connected inverters $U40_3$, $U40_4$, $U40_5$ and $U40_6$ with the output connected to pin 33 of amplifier U82.

A positive 15 volts is connected to sample and hold U27 pin 1 and a negative 15 volts is connected to pin 4 of U27. Capacitors C23, C39 and C24 are decoupling capacitors and diode CR48 suppresses switching transients. Pin 7 of sample and hold U27 is connected to pin 2 ($V_{IN-}$) of ADC U21. Pin 5 of U27 is connected to pin 3 ($V_{IN+}$) of ADC U21 through resistor R31 and to $D_{VCC}$ through diode CR4 for overvoltage protection. A bootstrap circuit 8 provides galvanic isolation.

Pin 2 ($V_{IN-}$) of ADC U21 as well as pin 4 (AGND) and pin 12 (DGND) are connected to analog common 7. Pin 24 ($D_{VCC}$) of ADC U21 is connected to $D_{VCC}$ with decoupling capacitor C37 and C38. Pin 6 ($A_{VCC}$) of ADC U21 is connected to $A_{VCC}$ with decoupling capacitors C32 and C33. Pin 1 (V−) of U21 is connected to negative 15 volts and pin 5 ($V_{REF}$) of U21 is connected to $V_{REF}$ and with decoupling capacitor C91.

ADC U21 is a CMOS device having a differential input comprising pins 2 and 3 with pin 2 tied to ground in a single ended mode. ADC U21 is a 12 bit device plus sign and uses a folded successive approximation technique in which the inputs are applied to the input comparator independent of their polarity. The converter uses an 8 bit bus and uses two successive readings of the same bit port. The clock originates from PCLK divided by two in toggle U10.

Pins 16-23 (DB0-D87) of ADC U21 are connected to the microcontroller (not shown) along with pins 13, 8, 14, 7, 17, 4, 18, 3 (BD0-BD7) of register U20 through bus BD0-7. Pin 14 (RDY) of ADC U21 is serially connected to inverters $U9_1$ and $U9_2$ and resistor R146 in parallel with diode CR45. The inverters are coupled to READY of the microcontroller. Pin 10 (CS) of U21 is connected to ADCS, pins 9 (WR) and 11 (RD) connectable to IOWC and IORC respectively of the microcontroller. Pin 13 (STATUS) select line originates in the analog input register U20 and is used to elect the data buffer or the status buffer. Pin 15 (INT) is connectable to AINTI through an inverter $U9_3$ and pin 8 (CLK) to pin 5 of U10.

The voltage reference is obtained from a very high precision reference U11 which provides $V_{REF}$ of approximately 5.12 volts from pin 6 of U11. Pin 2 of U11 is connected to positive 15 volts and decoupling capacitor C25 with pin 4 connected to analog common 7. Adjustment Pin 5 is connected to voltage resistors R21, R24 and R27.

VR1 provides $A_{VCC}$ and $D_{VCC}$ at output O with the input I connected to positive 15 volts with decoupling capacitors C27, C28. Diode CR43 is connected between pin G of VR1 and ground with resistor R22 connected between pin G and $D_{VCC}$. VRI serves as a power regulator for ADC U21. Since U21 is a +5 volt CMOS device, the output of VRI is raised by diode CR43 to raise that voltage to 5.3 to encompass the entire analog range as well as allow a few millivolts of buffer.

The analog to digital converter U21 is run from reference U11 adjusted to approximately 5.12 volts which allows a full scale input of +or −5.12 volts, a voltage reference for U21. ADC U21 is run as a not ready system so that it must issue a ready signal to the high speed processor. The ADC U21 is sufficiently slow that the processor has to wait for the ready signal. Whenever a chip select is received on the ADCS, the system automatically flips over from a ready system to a not ready system utilizing U9, resistor R46 circuit coupled to the RDY pin of U21.

External and internal channels are selected by the respective relays through a register U20 which generates an output on address lines MA0 through MA3 which is decoded by U41 and U52 and drives a selected pair of LED's closing the corresponding contacts of the relay.

Address lines MA0-MA3 are connected between pins 12, 9, 15 and 6 respectively of register U20 and pins 1-4 (A, B, C, G2A) of decoder U52 and pins 1, 2, 3, 6 (A, B, C, G1) of decoder U41. Pins 6 and 16 (G1 and $V_{CC}$) of U52 are connected to $V_{CC}$ and pins 8 and 5 (G and G2B) are connected to ground. Pin 16 of U41 is connected to $V_{CC}$ and pins 8, 5, 4, are connected to ground. Pins 7 and 9-15 of decoder U41 and pins 14 and 15 of decoder U52 are connected to pairs of light emitting diodes associated with respective relays K0-K9 and to $V_{CC}$ through resistor R17. Relay K10 has pins 3, 4 of a diode A connected to pin 13 and pins 5, 6 of diode B connected to pin 12 of U52 with both diodes connected to $V_{CC}$ through resistor R65 as well as R17.

All the power for the primary side is supplied by isolation amplifier U82 thereby obviating the need for an external supply as well as providing high input impedance. As seen in the figure, the solid line 6 represents a thick circuit trace connected to earth with optical and galvanic isolators bridging the barrier and isolating the primary from the secondary side of the circuit.

As stated supra, U52 and U41 in the secondary are both decoders used to select a particular relay or channel that is scheduled to be digitized. Register U20 is the control register where the processor of the microcontroller writes the appropriate control words to select the channel and gain range and when to go into the hold mode of U27 and the ADC U21.

The microcontroller includes appropriate drivers to manage the operations of the circuit's analog input section and, although not part of the instant invention per se will be summarized as follows. The measurement firmware includes the autoranging feature mentioned supra which selects the proper analog input gain for the signal being measured.

The analog input driver performs a complete conversion every 10 milliseconds. It converts the eight field input channels in numerical order and then measures one of the internal channels including the references of K8 and K10. Each field input is scanned every 90 milliseconds while the internal quantities are scanned every 630 milliseconds.

Figure 2:
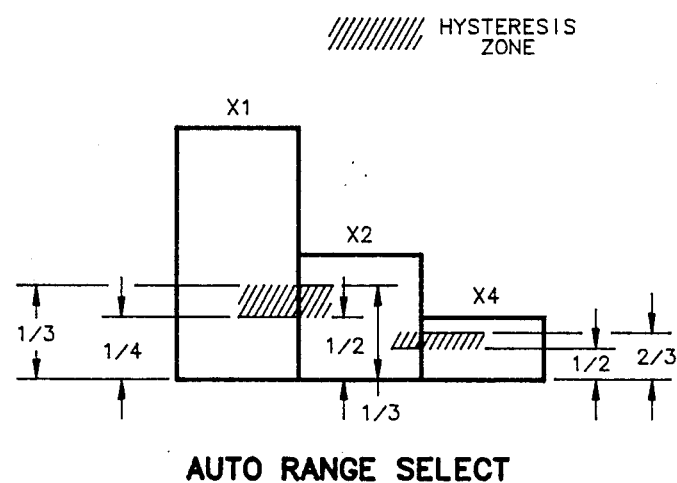
FIG. 2 is an illustration of an autoranging algorithm useful with the circuit and FIG. 3 is a truth chart for making adjustments to the analog signals received by the circuit.

FIG. 2 illustrates the autoranging algorithm wherein a channel gain of 1, 2, 4 or 8 times appropriate for the signal being measured is automatically selected.

The autoranger looks at the current value of a signal. If the value of the signal is below the ¼ full-scale mark for a current range, the autoranger selects the next larger gain for the next scan of that channel. If the value of the signal is above the ⅜ full-scale mark for the current range the autorangers selects the next smallest gain for the next scan of that channel.

The algorithm includes hysteresis to prevent gain range "oscillation" for signals at or near a gain-change threshold.

If a reading is at full-scale indicating an overrange condition, that reading is discarded for the current scan to avoid introducing errors into the averaging process. The gain is changed to the next lowest value, if not currently on the lowest value, and the reading from the next scan is used.

Measurements from each of the eight field input channels are adjusted for offset. The offset is based on measured ground potential at that gain range, and adjusted for span based on the analog reference voltage.

The analog input drivers keep track of four readings for each channel and perform averaging on the readings. Then the averaged readings are put into another part of the AI database. this is known as a four-cycle smoothing algorithm.

After each new measurement for a channel is taken and scaled, the driver "ripples-down" the first three readings in that channel's records. The oldest reading is discarded and the third most recent reading becomes the fourth most recent reading, etc. The new measurement is put into the position of the most recent reading.

Figure 3:
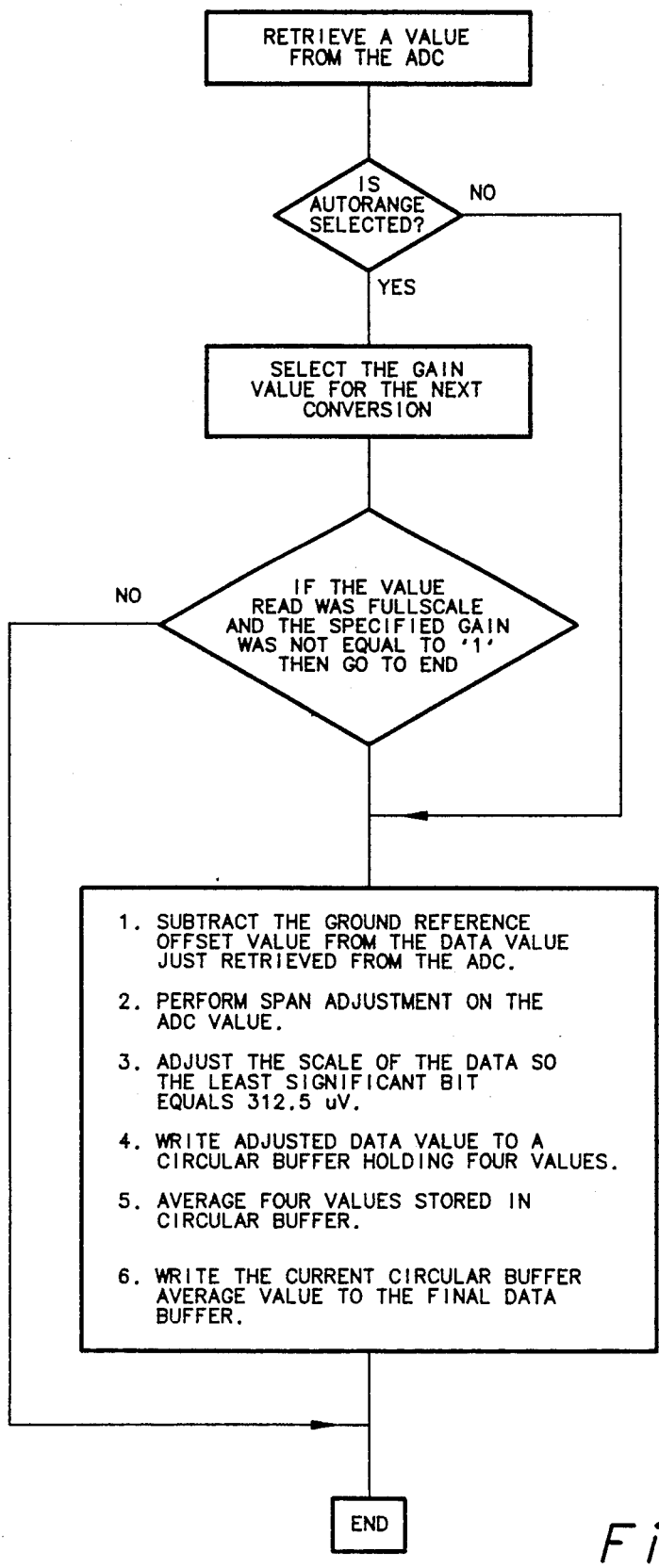

With reference to FIG. 3 it will be seen that the following tasks are performed after the appropriate gain is selected:

1. Subtract the ground reference offset value from the data value just received from the ADC.
2. Perform span adjustment on the ADC value.
3. Adjust the scale of the data so the least significant bit equals 312.5 uV.
4. Write adjusted data value to a circular buffer holding four values.
5. Average four values stored in circular buffer and
6. Write the current circular buffer average value to the final data buffer.

A circuit made in accordance with the invention was built using the following components.

| K0-K10 | SP3301/3354 | R41 | 10K ohms | C95 | 100 pF |
|---|---|---|---|---|---|
| U83 | 509/6208 | RN3 | 20K ohms | C94 | 100 pF |
| U82 | AD204 | R43 | 40.2K ohms | C57 | 100 pF |
| U53 | ILD2 | R45 | 2K ohms | C55 | 22 mF |
| U84 | REF02 | R42 | 20K ohms | C56 | 22 mF |
| U40 | 4049 | R46 | 10 ohms | C86 | 6.8 mF |
| U9 | 74HC14 | R44 | 500 ohms | C39 | .1 F |
| U21 | ADC1205 | R48 | 500 ohms | C24 | 6.8 mF |
| U20 | 74HC373 | R49 | 20K ohms | C23 | 6.8 mF |
|  |  | R40 | 20K ohms | C37 | .1 F |
| U11 | REF02 | R39 | 20K ohms | C38 | 6.8 mF |
| VR1 | 78L05 | R61 | 4.64K ohms | C32 | .1 F |
| U41 | 74HC 138 | R134 | 100K ohms | C33 | 6.8 mf |
|  |  | R136 | 4.64K ohms | C26 | 6.8 mF |
| U52 | 74HC 138 | R135 | 20K ohms | C53 | 1000 pF |
|  |  | R63 | 10K ohms | C91 | 6.8 mF |
| U27 | LF398AN | R64 | 50K ohms | C25 | .1 mF |
| U10 | 74HC74 | R62 | 10K ohms | C27 | .1 mF |
|  |  | R28 | 2K ohms | C28 | .1 mF |
|  |  | R31 | 2.21 ohms | CR49 | 1N914 |
|  |  | R26 | 5.11K ohms | CR48 | 1N4745A |
|  |  | R23 | 1 meg ohms | CR4 | 1N914 |
|  |  | R146 | 33.2K ohms | CR43 | 1N5713 |
|  |  | R27 | 100K ohms |  |  |
|  |  | R24 | 10K ohms |  |  |
|  |  | R21 | 10K ohms |  |  |
|  |  | R22 | 10K ohms |  |  |
|  |  | R69 | 2K ohms |  |  |
|  |  | R68 | 2K ohms |  |  |
|  |  | R17 | 249 ohms |  |  |
|  |  | R65 | 249 ohms |  |  |

It will thus be seen that by means of the invention multiplexing of a plurality of analog signals is achieved while still maintaining high channel to channel isolation and I/O isolation from common mode voltage. The circuit uses low power yet provides high reliability over a wide temperature range. The invention permits digitization of relatively wide band signals. Signal integrity is maintained by inputting selectable amplification at the front end of the isolation amplifier resulting in noise rejection. Any error introduced in the amplification stage is corrected through software compensation utilizing an offset, a voltage and a temperature reference with a three point correction algorithm.

Having described the invention in connection with a specific embodiment thereof, it is to be understood that modifications may now suggest themselves to those skilled in the art and it is intended to cover such modifications as fall within the scope of the appended claims.

What is claimed is:

1. An analog input circuit for inputting voltage signals to a controller comprising a circuit board, primary and secondary sides of the circuit disposed on the circuit board separated from one another by an earth drain disposed therebetween on the circuit board, the primary side comprising a plurality of independent channels isolated from each other and from common mode environment each having differential solid state relay switches with positive and negative inputs and outputs, the positive output coupled to an input stage of an isolation amplifier, the negative output coupled to a signal common, a gain producing means including a multiplexer, the gain producing means coupled to the input stage of the isolation amplifier, and the secondary side comprising an output of the isolation amplifier isolated by a transformer coupling from the input thereto, the output of the isolation amplifier coupled to a sample and hold circuit, the sample and hold circuit having an output coupled to an analog to digital converter, an analog input register coupled to an input of an optical isolator, the optical isolator having an output coupled to the multiplexer, the analog input register further coupled to the sample and hold circuit to multiplex the independent channels and cause the sample and hold output to be processed by the analog to digital converter, the analog to digital converter having an output connectable to a controller, whereby the channels are isolated from one another and from common mode voltage with the amplifier floating with reference to the input common mode voltage for each selected channel.

2. An analog input circuit according to claim 1 in which the circuit is powered by a CMOS free running oscillator coupled to the isolation amplifier.

3. An analog input circuit according to claim 1 in which the gain producing means comprises a resistor stack arranged as a voltage divider having a plurality of branches, each branch connected to a different input of the multiplexer, the multiplexer enabled by the analog input register through the optical isolator to select one of the branches to provide a corresponding gain to the isolation amplifier.

4. An analog input circuit according to claim 1 including over voltage protection means coupled between the output of the sample and hold circuit and the analog to digital converter.

5. An analog input circuit according to claim 1 further including internal channels having differential relay switches having inputs and outputs, the inputs coupled to selected references and the outputs coupled to the isolation amplifier to permit correction of the analog input signal on the primary side of the circuit.

6. An analog input circuit according to claim 1 including an internal channel having a differential relay switch connected to the positive and negative output of the plurality of channels and adapted to short out the output lines after each channel is denergized.

7. An analog input circuit according to claim 1 in which the solid state relay switches are optically isolated bidirectional MOSFET devices.

* * * * *